United States Patent
Lenzen et al.

(10) Patent No.: US 11,520,370 B2
(45) Date of Patent: Dec. 6, 2022

(54) DELAY ELEMENT, DELAY ELEMENT CHAIN AND FAST ALL-DIGITAL CLOCK FREQUENCY ADAPTATION CIRCUIT FOR VOLTAGE DROOP TOLERANCE

(71) Applicant: MAX-PLANCK-GESELLSCHAFT ZUR FÖRDERUNG DER WISSENSCHAFTEN E.V., Munich (DE)

(72) Inventors: Christoph Lenzen, Saarbrücken (DE); Matthias Függer, Cachan (FR); Ben Wiederhake, Saarbrücken (DE); Attila Kinali, Saarbrücken (DE); Mordechai Medina, Tel Aviv (IL)

(73) Assignee: Max-Planck-Gesellschaft zur Förderung der Wissenschaften E.V., Munich (DE)

( * ) Notice: Subject to any disclaimer, the term of this patent is extended or adjusted under 35 U.S.C. 154(b) by 0 days.

(21) Appl. No.: 16/975,128

(22) PCT Filed: Mar. 11, 2019

(86) PCT No.: PCT/EP2019/056007
§ 371 (c)(1),
(2) Date: Aug. 23, 2020

(87) PCT Pub. No.: WO2019/170913
PCT Pub. Date: Sep. 12, 2019

(65) Prior Publication Data
US 2021/0089073 A1  Mar. 25, 2021

(30) Foreign Application Priority Data
Mar. 9, 2018  (EP) .................... 18161033

(51) Int. Cl.
*G06F 1/08* (2006.01)
*H03L 7/081* (2006.01)
*H03L 7/097* (2006.01)

(52) U.S. Cl.
CPC .............. *G06F 1/08* (2013.01); *H03L 7/0818* (2013.01); *H03L 7/097* (2013.01)

(58) Field of Classification Search
CPC ..... G06F 1/08; H03L 7/00; H03L 7/06; H03L 7/08; H03L 7/081; H03L 7/0812; H03L 7/0818; H03L 7/085; H03L 7/097
See application file for complete search history.

(56) References Cited

U.S. PATENT DOCUMENTS

| | | | | |
|---|---|---|---|---|
| 7,548,127 B2 * | 6/2009 | Morini | ................. | H03K 3/0315 331/177 R |
| 8,786,340 B1 * | 7/2014 | Yong | ..................... | H03L 7/0814 327/158 |

(Continued)

FOREIGN PATENT DOCUMENTS

WO  2007120670 A2  10/2007

OTHER PUBLICATIONS

WIPO, International Preliminary Report on Patentability Chapter I, for PCT/EP2019/056007, dated Sep. 15, 2020 (7p.).

(Continued)

*Primary Examiner* — Diana J. Cheng
(74) *Attorney, Agent, or Firm* — Siritzky Law, PLLC

(57) ABSTRACT

A circuit for delaying an electric signal (CI), comprises an input for the electric signal (CI); an input for a control signal (EI); a first storage element (U5) for storing the control signal; a delay element for delaying the electric signal; and an output for the delayed electric signal (CO). According to the invention, the electric signal is delayed, based on the stored control signal. The delay circuit is employed in a fast (Continued)

all-digital clock frequency adaptation circuit for voltage droop tolerance.

10 Claims, 14 Drawing Sheets

(56) References Cited

U.S. PATENT DOCUMENTS

| | | | |
|---|---|---|---|
| 10,141,942 B1* | 11/2018 | Satoh | H03L 7/143 |
| 10,411,720 B2* | 9/2019 | Lenzen | H03L 7/0995 |
| 2007/0247240 A1 | 10/2007 | Morini et al. | |
| 2014/0254734 A1* | 9/2014 | Abdelmoneum | H03L 7/0995 |
| | | | 375/376 |
| 2017/0301381 A1* | 10/2017 | Seomun | G11C 7/222 |

OTHER PUBLICATIONS

WIPO, International Search Report, for PCT/EP2019/056007, dated Sep. 12, 2019 (3p.).

WIPO, Written Opinion of the International Searching Authority, for PCT/EP2019/056007, dated Sep. 12, 2019 (6p.).

* cited by examiner (a) Behaviour when the U5 flip-flop stores a clear (), meaning „slow"

(a) Behaviour when the U5 flip-flop stores a clear 1, meaning „fast"

DELAY ELEMENT, DELAY ELEMENT CHAIN AND FAST ALL-DIGITAL CLOCK FREQUENCY ADAPTATION CIRCUIT FOR VOLTAGE DROOP TOLERANCE

This application is a 371 of International application PCT/EP2019/056007, filed Mar. 11, 2019, and which claims priority from European patent application no. 18161033.8, filed Mar. 9, 2018, the entire contents of both of which are hereby fully incorporated herein by reference for all purposes.

The project leading to this application has received funding from the European Research Council (ERC) under the European Union's Horizon 2020 research and innovation programme (grant agreement No. 716562).

The present invention relates to a clock frequency adaptation circuit for voltage droop tolerance.

INTRODUCTION

Correctness of synchronous circuit designs relies on the assumption that signal propagation through the combinational logic is complete before the next active clock edge. Temperature and voltage variations lead to dynamically changing interconnect and transistor delays, and are classically alleviated by decreasing the clock frequency such that a single clock period always provides sufficient time, even in face of worst-case temperature-voltage conditions. These effects, together with worst-case assumptions on aging and process variation, lead to a large frequency guardband that results in under-utilization of the circuit under normal conditions.

Power supply plays a central role when designing the guardband: Sensitivity of gate propagation delay increases with lower $V_{CC}$: a 1% voltage droop results in up to 4% delay change in 90 nm technology with $V_{CC}$=0.9V [C. Tirumurti, S. Kundu, S. SurKolay, and Y.-S. Chang, "A modeling approach for addressing power supply switching noise related failures of integrated circuits," in DATE, vol. 2. IEEE, 2004, pp. 1078-1083]. The trend to decrease $V_{CC}$ suggests that the situation will gain in importance for future chip generations. In [M. Saint-Laurent and M. Swaminathan, "Impact of power-supply noise on timing in high-frequency microprocessors," IEEE ADVP, vol. 27, no. 1, pp. 135-144, 2004] it was shown that a major part of the guardband is required to account for power supply noise, with more than 6% loss in attainable clock frequency for a 130 nm processor. In [K. Bowman, C. Tokunaga, J. Tschanz, A. Raychowdhury, M. Khellah, B. Geuskens, S.-L. Lu, P. Aseron, T. Karnik, and V. De, "Dynamic variation monitor for measuring the impact of voltage droops on microprocessor clock frequency," in CICC. IEEE, 2010, pp. 1-], a 12% voltage droop at 100 MHz was injected into a 45 nm microprocessor, already requiring a 16% reduction of clock frequency to account for increased critical path delay.

Several techniques for handling slowly changing environmental conditions have been proposed, ranging from process variation compensation [S. Borkar, T. Karnik, S. Narendra, J. Tschanz, A. Keshavarzi, and V. De, "Parameter variations and impact on circuits and microarchitecture," in DAC. ACM, 2003, pp. 338-342]. However, compensation techniques typically involve significant sensing and response times that prevent their application for fast environmental changes with dynamics in the order of a single clock period. Supply voltage noise, induced by switching activities with high dI=dt, was shown to have its main frequency components in the 100-300 MHz range with amplitudes around 10% [N. Kurd, P. Mosalikanti, M. Neidengard, J. Douglas, and R. Kumar, "Next generation intel core micro-architecture (nehalem) clocking," IEEE SSC, vol. 44, no. 4, pp. 1121-1129, 2009], [D. Jiao, J. Gu, and C. H. Kim, "Circuit design and modeling techniques for enhancing the clock-data compensation effect under resonant supply noise," IEEE SSC, vol. 45, no. 10, pp. 2130-2141, 2010]. While ultra-high frequency components in the order of 10-100 GHz are local to the switching circuit, the high-frequency components in the 100-1000 MHz range are due to die and package LC and are global across the chip [A. Muhtaroglu, G. Taylor, and T. Rahal-Arabi, "On-die droop detector for analog sensing of power supply noise," IEEE SSC, vol. 39, no. 4, pp. 651-660, 2004].

For systems in which local handshaking poses a too large circuit overhead, globally adaptive methods have been investigated. In [J. Cortadella, M. Lupon, A. Moreno, A. Roca, and S. S. Sapatnekar, "Ring oscillator clocks and margins," in Asynchronous Circuits and Systems (ASYNC), 2016 22nd IEEE International Symposium on. IEEE, 2016, pp. 19-26], the authors advocate the use of on-die ring oscillators instead of externally generated clock signals: ring oscillators are shown to have advantageous correlation between frequency and critical path delays in presence of droops. However, this approach has its own drawbacks. Communication with other clock regions, including the periphery, becomes harder, as adaptive ring oscillators provide no simple way to deduce the phase relation to some absolute frequency. More importantly, such oscillators tend to require larger timing margins, and stability guarantees on frequency and drift are harder to achieve.

Accordingly, several works seek to adapt a stable, external reference clock signal. Besides improved stability guarantees, an advantage of such an approach is that deriving multiple adaptive clocks from the same stable reference clock may allow for easier trackinging of their phase relations.

In [J. Tschanz, N. S. Kim, S. Dighe, J. Howard, G. Ruhl, S. Vangal, S. Narendra, Y. Hoskote, H. Wilson, C. Lam et al., "Adaptive frequency and biasing techniques for tolerance to dynamic temperature-voltage variations and aging," in ISCC. IEEE, 2007, pp. 292-604], the clock frequency adjustment is split into a fast and a slow adjustment. The fast adjustment is performed by switching between three PLLs, while the slow adjustment is performed by adjusting the individual PLL frequencies. As the PLL outputs are not synchronized, switching between them incurs the risk of metastability and short clock cycles. In [T. Fischer, J. Desai, B. Doyle, S. Naffziger, and B. Patella, "A 90-nm variable frequency clock system for a power-managed itanium architecture processor," IEEE SSC, vol. 41, no. 1, pp. 218-228, 2006], an adaptive clocking system for a 90 nm processor running at nominal 2.2 GHz and $V_{CC}$=1.2V is proposed. It senses voltage droops and, via an arbiter, selects a new clock signal with an adjusted clock divisor. This technique is reported to tolerate droops of up to 30 mV/ns (i.e., 2.5% per ns, or about 1.1% per clock cycle) slope with average 700 ps response time (about 1.5 clock cycles). In [C. R. Lefurgy, A. J. Drake, M. S. Floyd, M. S. Allen-Ware, B. Brock, J. A. Tierno, and J. B. Carter, "Active management of timing guardband to save energy in POWER7," in MICRO-44. IEEE, 2011, pp. 1-11], an adaptive clocking system based on sensing droops and adjusting a fast digitally controlled oscillator (DCO) that triggers a slowly changing frequency correction is presented. The attained response time is 8 to 10 clock cycles for a 45 nm processor with nominal frequency of about 3.8 GHz.

In [K. Bowman, C. Tokunaga, J. Tschanz, A. Raychowdhury, M. Khellah, B. Geuskens, S.-L. Lu, P. Aseron, T. Karnik, and V. De, "Dynamic variation monitor for measuring the impact of voltage droops on microprocessor clock frequency," in CICC. IEEE, 2010, pp. 1-4], a Dynamic Variation Monitor (DVM) based on mixed gateinterconnect delay line monitoring was proposed to track delay changes in critical paths. It was applied in [K. A. Bowman, C. Tokunaga, T. Karnik, V. K. De, and J. W. Tschanz, "A 22 nm all-digital dynamically adaptive clock distribution for supply voltage droop tolerance," IEEE SSC, vol. 48, no. 4, pp. 907-916, 2013] to tolerate steep voltage droops that require fast adaptations: the authors propose to route the clock signal over delay lines that have similar voltage-delay dependencies as the critical paths. This allows automatic and fast stretching of the clock signal on a negative droop slope. The potentially hazardous compression of the clock signal on the successive positive droop slope is prevented by masking the clock output until the droop is over and clock periods are nominal again. Masking is triggered by a 2 clock cycle delayed error signal, of which one cycle is used for synchronization. While this approach is faster than the above approaches, it still results in a control latency with additive synchronization delay, which is likely to be more than 1 cycle for reliable designs. Furthermore, it completely stops the clock (by masking) until the droop and cycle compression are over.

Likewise, the design in [K. Wilcox, R. Cole, H. R. F. III, K. Gillespie, A. Grenat, C. Henrion, R. Jotwani, S. Kosonocky, B. Munger, S. Naffziger, R. S. Orefice, S. Pant, D. A. Priore, R. Rachala, and J. White, "Steamroller module and adaptive clocking system in 28 nm cmos," IEEE Journal of Solid-State Circuits, vol. 50, no. 1, pp. 24-34, 2015] is tailored to tolerate fast, steep voltage droops: their droop detector uses a delay line to detect droops within a clock cycle. The binary detection signal is then synchronized (resulting in a 2 clock cycle synchronization delay) and shifts the phase by selecting a proper output from a tapped delay-locked loop (DLL). The output clock runs at 3 to 4G Hz in 28 nm CMOS.

It is an object of the present invention to provide a fast all-digital clock frequency adaptation circuit for voltage droop tolerance.

This object is achieved by a delay circuit according to the independent claim and a frequency adaptation circuit using the delay circuit according to claim 12. Advantageous embodiments are defined in the dependent claims.

In general, the invention proposes a mechanism that significantly reduces the frequency guardband in ideal conditions while ensuring correct operation even during frequent and steep voltage droops.

The main idea is to remove the additive synchronization delay from the critical path in the control loop, by making use of metastability-containing circuit design: $V_{CC}$ is sensed by standard means, e.g., voltage comparators [A. Muhtaroglu, G. Taylor, and T. Rahal-Arabi, "On-die droop detector for analog sensing of power supply noise," IEEE SSC, vol. 39, no. 4, pp. 651-660, 2004], and computations are carried out directly with the potentially metastable or unstable measurement, shifting the phase of the clock signal. After a certain number of clock cycles, chosen such that metastability has ceased with sufficiently high probability, the sensor values are used to adjust a DCO. Synchronization thus occurs in parallel to using the measurement values to shift the clock phase, hence does not incur any delay in reaction time. This method allows fast reaction to voltage droops by shifting the phase, and fine mid/long term adaptation by adjusting the DCO. This approach does not require to completely mask the clock signal during the voltage droop; the frequency of the generated clock output us merely decreased by a known (configurable) factor.

The invention also presents a simplification of the circuit that uses only one backpropagation rail instead of two, reducing the necessary guardband further and making it easier to find a drop-in replacement for the droop detection mechanism.

DETAILED DESCRIPTION

The description starts with the specification of a correct frequency adaption module FAM. Then, a a circuit FAM-I is specified and shown to be a correct implementation of the frequency adaption module. The circuit FAM-I consists of the submodules Droop Detector (DD), Delay Element (DE), and Phase Accumulator (φ).

Figure 1:
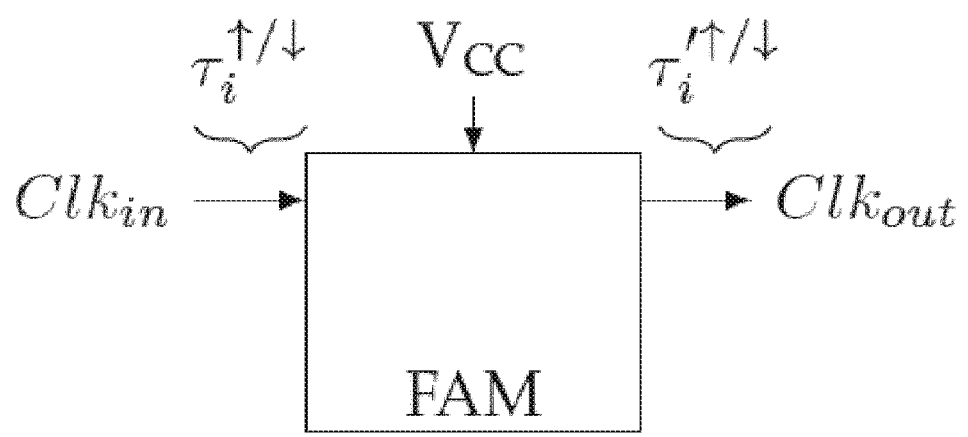
FIG. 1 shows a frequency adaptation module FAM according to an embodiment of the invention.

All module specifications are stated as a list of input assumptions (Ix) and output constraints (Cy). A module is correct if it fulfills all (Cy) if all (Ix) hold. FIG. 1 shows a frequency adaptation module FAM according to an embodiment of the invention. The input clock $Cl_{kin}$ is stretched according to VCC, resulting in the output clock $Clk_{out}$. The overall frequency adaptation system depicted in FIG. 1 is formalized by a module with two input ports and one output port.

One input signal is a clock signal with a fixed nominal frequency (which can be chosen much higher than the derived system clock), the other is the supply voltage. The clock signal is modeled by a sequence of times $(\tau_i^\uparrow) i \in \mathbb{N}$, where $\tau_i^\uparrow$ corresponds to the time the $i^{th}$ rising input clock edge occurs; analogously, $\tau_i^\downarrow$ is the time of the $i^{th}$ falling input clock edge. The supply voltage is given by $V_{CC}$ $\mathbb{R}_{\geq 0} \to [V_{min}, V_{max}]$, where $V_{CC}(t)$ is the voltage at time t.

The input is required to be well-behaved:

Assumption of well-separated input. The input clock fulfills $$\tau_i^\uparrow \geq 0, \forall i \in N : r_{i+1}^\uparrow - r_i^\uparrow \in [T_s^-, T_s^+],$$

and $\forall i \in N : r_i^\downarrow - r_i^\uparrow \in [T_s^-/2, T_s^+/2].$ (I1)

where $T_s^-$ and $T_s^+$ are the minimum and maximum duration of the "short" clock pulses it provides. The above essentially means a 50% duty cycle of the input clock, although this requirement can be relaxed.

Assumption on droops. The supply voltage satisfies that $$\forall t, t' \geq 0 : |V_{CC}(t) - V_{CC}(t')| \leq K|t-t'|,$$ (I2)

i.e., K bounds how steep a droop can be.

The only output is the clock signal, which during a voltage droop must slow down appropriately. The output is modeled by the sequence of times $(r_i^\uparrow) i \in N$, where $r'_i{}^\uparrow$ is the time the $i^{th}$ rising output clock edge occurs. $(r'_i{}^\downarrow) \in N$ is defined analogously. One will also need $T_l^-$ and $T_l^+$, the desired minimum and maximum period of the sloweddown clock, which has "long" periods, to accommodate increased switching times during droops. In summary, $T_s^- < T_s^+ < T_l^- < T_l^+$.

The frequency adaptation module is said to be correct if, given (I1) and (I2), it fulfills constraints (C1) and (C2):

Guarantee of well-separated output. Output clock edges are well-separated, i.e., $$r'_0{}^\uparrow \geq r_0^\uparrow \text{ and } \forall i \in N \; r'_{i+1}{}^\uparrow - r'_i{}^\uparrow \geq T_s^-.$$ (C1)

pA 50% duty cycle of the output clock is not required, but bounds will be shown for the inventive solution later on.

Guarantee of well-shifted output. The output clock always runs fast when the supply voltage has been sufficiently high during the previous cycle, and that it runs slow when the supply voltage was too low during the last clock cycle:

$$(\forall t \in [r'_{i-1}{}^\uparrow, r'_i{}^\uparrow] : V_{CC}(t) \geq V_{high}) \Rightarrow r'_i{}^\uparrow - r'_{i-1}{}^\uparrow \in [T_s^-, T_s^+],$$
and (C2)

$$(\exists t \in [r'_{i-1}{}^\uparrow, r'_i{}^\uparrow] : V_{CC}(t) \geq V_{low}) \Rightarrow r'_i{}^\uparrow - r'_{i-1}{}^\uparrow \geq T_l^-$$

The voltages $V_{low}$; $V_{high}$ define what is considered a droop. No implementation can work for arbitrarily close $V_{low}$; $V_{high}$. In summary, $V_{min} < V_{low} < V_{high} < V_{max}$.

While this specification does not explicitly require it, the proposed system also guarantees an amortized minimum frequency of $1/T_l^+$; in absence of metastability in the constructed delay chain, in fact no clock period is longer than $T_l^+$, and for a chain of length n, the maximum clock period is $T_l^+ + n(T_l^+ - T_s^+)$. These requirements and guarantees, especially (C2), could be phrased differently. The inventors attempted to capture a broad set of interpretations. Given more information about the specifics of the desired requirements and guarantees, the analysis can be tailored towards them, yielding slightly better results.

Central to the proposed solution are flip-flops with x-masking outputs, for $x \in \{0,1\}$: a flip-flop whose output is x if it is internally metastable. Note that such a flipflop only produces full-swing, fast transitions at its output, but no glitches or long intermediate voltage levels: when metastability resolves to $1-x$, it produces a (possibly arbitrarily late) transition from x to $1-x$; if metastability resolves to x, its output remains at x. Such flip-flops can be realized by successive high/low-threshold inverters; see e.g. [D. J. Kinniment, A. Bystrov, and A. V. Yakovlev, "Synchronization circuit performance," IEEE SSC, vol. 37, no. 2, pp. 202-209, 2002], [D. J. Kinniment, Synchronization and arbitration in digital systems. John Wiley & Sons, 2008. [19] M. Függer, A. Kinali, C. Lenzen, and B. Wiederhake, "Fast all digital clock frequency adaptation circuit for voltage droop tolerance," in IEEE International Symposium on Asynchronous Circuits and Systems (ASYNC), 2018].

Next, an abstract implementation of a frequency adaptation module, called FAM-I, will be presented, that consists of (i) a droop detector, (ii) a configurable delay chain comprising $n \geq 1$ conditional delay elements, and (iii) a digital phase accumulator.

Figure 2:
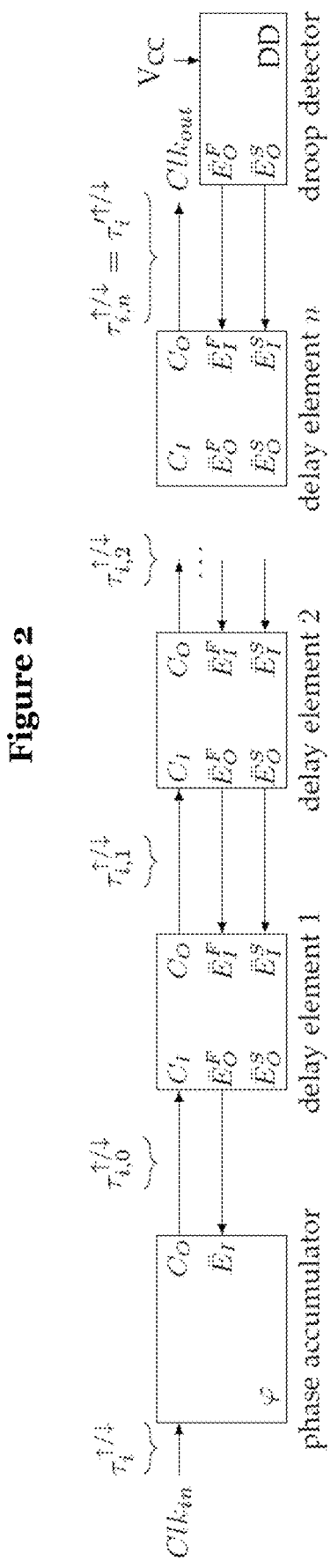
FIG. 2 shows a system architecture of the proposed frequency adaptation module implementation FAM-I according to an embodiment of the invention.

FIG. 2 shows system architecture of the proposed frequency adaptation module implementation FAM-I: the DD senses occurrence of a droop, and issues delay enable signals that travel through the pipe from right to left to the module. Clock signals travel from left to right and are delayed accordingly at the delay elements. Delay enable signals that arrive at are made permanent by shifting the phase of the input clock.

The three modules of FAM-I are specified and interconnected as follows:

(1) The Droop Detector DD continuously provides two single-bit digital measurement values of $V_{CC}$ at its outputs $\overline{E}_O^F$, $\overline{E}_O^S$. Note that these may be unstable or transitioning when being sampled, i.e., could induce metastability of storage elements. The output is lowactive, i.e., $\overline{E}_O^* = 0$ indicates presence of a voltagedroop and the request to slow down the clock (i.e., have a long clock period), $\overline{E}_O^* = 1$ absence and the request for a fast clock (period), and $\overline{E}_O^* = M$ an unstable signal. In case of such an unstable signal, $\overline{E}_O^F$ must be 1-masking (called fast-masking), and $\overline{E}_O^S$ 0-masking (called slow-masking). The output values are used for setting the rightmost delay element.

(2) Each conditional Delay Element DE delays the clock signal, from input $C_I$ to output $C_O$, based on a possibly metastable input $\overline{E}_I^F$, the delay enable signal: if $\overline{E}_I^F = 1$ by a short delay within $[T_s^-, T_s^+]$, and if $\overline{E}_I^F = 0$ by a long delay within $[T_l^-, T_l^+]$. Potential uncertainties in $\overline{E}_I^F$ due to unstable or metastable input are transformed into delay uncertainties. Several of these building blocks are combined into a pipeline that is fed from right to left, as depicted in FIG. 2. Delay elements essentially shift their delay enable to the left, i.e., from $\overline{E}_I^S$ to $\overline{E}_O^*$, triggered by their local clock $C_O$. The chain is long enough such that a stored measurement value traveling through it from right to left is sufficiently unlikely to be unstable: the pipeline acts as a synchronizer chain.

(3) The purely digital Phase Accumulator φ takes the oldest delay enable signal, forwarded by the leftmost delay element, at its input $\overline{E}_I$, and accumulates the delay value into its phase offset. This requires that the delay enable input $\overline{E}_I$ is metastability-free at the time it arrives at the phase accumulator. The phase accumulator skips (i.e., masks) a clock cycle whenever its accumulated phase offset reaches a full period.

What follows is a detailed specification of the modules. Delays in all module specifications are in terms of time ranges. This does not only allow to capture standard jitter and imbalance within the circuit, but also accounts for the effect of a voltage droop on the frequency adaptation module itself. For example, the present model accounts for the fact that a delay element operating in long delay mode propagates the clock signal with delay $T_l^-$ in presence of full Vdd, and with up to delay $T_l^+$ in presence of a voltage droop. This allows to capture clock pulse shrinking and stretching effects caused by voltage droops as observed in [Bowman et al., ibid]. For succinctness and in the interest of readability, however, single variables will be used instead of intervals for a time range in the following, with the understanding that the timing analysis has to respect the respective upper and lower bounds. For example, $T_s$ will be written instead of the interval $[T_s^-, T_s^+]$, $d \leq T$ instead of $d \leq T_s^-$, $d \geq T_s$ instead of $d \geq T_s^+$, and $d = T_s$ instead of $d \in [T_s^-, T_s^+]$. Also needed will be the common timing parameters for what boils down to the properties of the underlying storage elements: $t_{set}$, $t_{hold}$, $t_{prop}$, $t_{ofs}$, which are the setup, hold, and propagation times of the circuits, as well as the offset between the active clock edge and the time the input is captured.

The behavior of module φ (phase accumulator) is modeled in a straightforward way. The component has an internal state (the accumulated phase shift), and two inputs: the single-bit signal $\overline{E}_I$ indicating whether to increase the phase offset, and the clock signal $Clk_{in}$ generated by the source clock, e.g., an external free-running quartz oscillator. It outputs a clock signal $C_O$ derived from $Clk_{in}$, whose pulses are phaseshifted appropriately. Specifically, this means that one has to add phase shift values, handle overflow as clock gating, and must be able to complete this within $T_s^-$ time even during a voltage droop. According to the invention, this is can be achieved by a simple and fast circuit.

Formally, let the sequences $\tau_i^\uparrow, \tau_i^\downarrow, r_{i,0}^\uparrow, r_{i,0}^\downarrow$ be the times of the rising and falling edges of the input and output clock signals, respectively (the 0 indicates that φ is the "$0^{th}$" element of the delay chain). It is assumed that (I1) holds for Module φ's clock input. The variable $b_{i,0}$ denotes the digital interpretation of $\overline{E}_I$ around time $r_{i,0}^\uparrow$, i.e., for $b \in \{0,1\}$, $b_{i,0} = b$ if $\forall t \in [-t_{set}, t_{hold}]$: $\overline{E}_I(r_{i,0}^\downarrow + t_{ofs} + t) = b$ (where $\overline{E}_I$ is scaled accordingly). It is assumed:

Assumption of metastability-free input. There always is such a value b, which will be argued to hold with high probability later.

$$b_{i,0} \in \{0,1\} \quad (I3)$$

The total shift count can now be defined $B_i = \Sigma_{k=0}^{i-1}(1-b_{k,0})$. The Phase Accumulator is correct if, given (I1) and (I3), conditions (C3) and (C4) hold:

Guarantee of well-shifted output. Let Q be the quotient of the clock period increase, i.e., $T_l/T_s = 1 + 1/Q$, and assume Q is in N. The output clock $C_O$ is shifted according to the amount indicated by all previous rounds' $b_{i,0}$:

$$q = \lfloor B_i/Q \rfloor, r_i = B_i - q_i \cdot Q, \text{ and}$$

$$r_{i,0}^\uparrow = r_{i,q_i}^\uparrow + \delta_\varphi + r_i \cdot T_s/Q \quad (C3)$$

where $\delta_\varphi$ accounts for internal gate and wire delays of the module (like $T_s$, it is shorthand for an interval).

Guarantee on high-time. The high-time of each pulse in the output clock signal $C_O$ is bounded by $$r_{i,0}^\downarrow - r_{i,0}^\uparrow = T_s/2 \quad (C4)$$

The delay element DE has three inputs $\overline{E}_I^F$, $\overline{E}_I^S$ and $C_I$, and three corresponding outputs $\overline{E}_O^F$, $\overline{E}_O^S$ and $C_O$, connected like a REQ/ACK pipeline. Clock output $C_O$ is the clock input $C_I$, potentially delayed by an additional up to $T_s/Q$ time. Inputs $\overline{E}_I^*$ provide the delay enable, representing the (lowactive) decision whether the clock needs to be delayed or not. Outputs $\overline{E}_O^*$ propagate this delay enable backwards in the chain, at the occurrence of the next local falling edge of C. The output $\overline{E}_I^F$ is used for the internal decision whether to add delay, whereas $\overline{E}_I^S$ is propagated to both outputs $\overline{E}_O^*$.

Distinguishing between the local and forwarded "copy" of the delay enable is relevant only if the input is unstable, a case that will carefully be handled using metastability masking techniques.

Formally, it is required that the input signal at $C_I$ is a "clean" clock signal, i.e., it has sharp edges between periods of strong-high and strong-low signals (as the invention considers unstable inputs, this will need to be shown to be true in the proof of correctness); the module guarantees the same for its clock output $C_O$. Denote by $r_{i,j}^\uparrow$ and $r_{i,j}^\downarrow$ the sequences of times of the rising and falling output clock edge of the $j^{th}$ delay element, respectively. Therefore, $r_{i,j-1}^*$ is the occurrence of the respective rising/falling input clock edge.

Observe that $r_{i,j-1}^\uparrow$ and $r_{i,j-1}^\downarrow$ fully describe the clock input $C_I$ to the $j^{th}$ element, where the first element receives $r_{i,0}^\uparrow$ and $r_{i,0}^\downarrow$ from φ. The following requirements are made:

Assumption of well-separated input.

$$r_{i,j-1}^\uparrow - r_{i-1,j-1}^\uparrow \geq T_s^- \text{ and} \quad (I4)$$

$$r_{i,j-1}^\downarrow - r_{i,j-1}^\uparrow = T_s/2, \quad (I5)$$

i.e., the clock period is at least $T_s^-$ and the high time is $T_s/2$.

Then the same guarantees are ensured for the clock output:

Guarantee of well-separated output.

$$r_{i,j}^\uparrow - r_{i-1,j}^\uparrow \geq T_s^- \text{ and} \quad (C5)$$

$$r_{i,j}^\downarrow - r_{i,j}^\uparrow = T_s/2, \quad (C6)$$

It remains to specify how the module responds to the delay enable inputs. To this end, for $* \in \{S, F\}$ one defines $b_{i,j}^*$ as the digital abstraction of the respective signal at the input port $E_I^*$ of the $j^{th}$ delay element, using the mapping $$b_{i,j}^* = \begin{cases} 0 & \forall t \in [-t_{set}, t_{hold}]: \overline{E}_1^*(r_{i,j}^\downarrow + t_{ofs} + t) = 0 \\ 1 & \forall t \in [-t_{set}, t_{hold}]: \overline{E}_1^*(r_{i,j}^\downarrow + t_{ofs} + t) = 1 \\ M & \text{otherwise} \end{cases}$$

where $\overline{E}_I^*$ is scaled such that 1 represents a strong-high, 0 a strong-low, and M any voltage in between. Intuitively, $b_{i,j}^*$ is the resulting state of a flip-flop with input $\overline{E}_I^*$ latched at time $r_{i,j}^\downarrow + t_{ofs}$, where M represents metastability resulting from a setup/hold time violation or otherwise unclean signal.

As the outputs $\overline{E}_O^*$ are fed to the module to the left, $b_{i,j-}^*$ is given in terms of $\overline{E}_O^*$ latched at time $r_{i,j-1}^\downarrow + t_{ofs}$.

With this, one may require:

Assumption of proper masking.

$$b_{i,j}^S b_{i,j}^F \in \{00, 0M, 01, M1, 11\} \quad (I6)$$

Also, if the element adds delay, one needs the guarantee that the one to the left (providing $C_I$ as its clock output) does the same on the next clock pulse, as otherwise one would have to choose $T_s$ conservatively, defeating the purpose of the present construction. Hence, one also demands:

Assumption of delayed input.

$$b_{i,j-1}^F = 0 \Rightarrow r_{i+1,j-1}^\uparrow - r_{i+1,j-1}^\uparrow \geq T_l^-. \quad (I7)$$

One now uses $b_{i-1,j}^F$ to decide whether or not to delay the $i^{th}$ clock pulse. $b_{i-1,j}^S$, on the other hand, is used to forward the delay enable. If $b_{i-1,j}^F = M$, one is satisfied with ensuring (C1)-(C3), where (C3) is achieved by guaranteeing that $b_{i-1,j}^F = M \Rightarrow B_{i-1,j}^S = b_{i,j-1}^F = 0$ by masking metastability. If $b_{i-1,j}^S = M$, one guarantees that $b_{i-1,j}^F = 1$ by masking metastability. Both properties together (captured by (C10)) ensure that if a delay enable input causes any delay for a pulse i, then it is guaranteed to delay all following pulses by $Q/T_s$ time, which lies at the heart of the correctness proof.

Guarantee of delayed output and delay propagation.

$$b_{i,j}^F = 1 \Rightarrow r_{i+1,j}{\uparrow} - r_{i,j}{\uparrow} \geq T_s^+ \quad \text{(C7)}$$

$$b_{i,j}^F = 0 \Rightarrow r_{i+1,j}{\uparrow} - r_{i,j}{\uparrow} \geq T_k^+ \quad \text{(C8)}$$

$$b_{i,j}^S = b \in \{0,1\} \Rightarrow b_{i+1,j-1}^S = b_{i+1,j-}^F = b \quad \text{(C9)}$$

$$b_{i+1,j-1}^S b_{i+1,j-1}^F \in \{00, 0M, 01, M1, 11\}. \quad \text{(C10)}$$

Formally, the Delay Element is correct if (C5)-(C10) hold, given that (I4)-(I7) hold.

Finally, the Droop Detector module DD provides a discrete, but potentially unstable or metastable value of whether a droop has occurred; see e.g. [A. Muhtaroglu et al., ibid] for an implementation. To enable the inventive masking strategy, however, the invention uses a high and a low output threshold to generate two signals $\overline{E}_O^*$, $* \in \{S, F\}$, which are fed as $\overline{E}_I^*$ to the rightmost delay element. It is required that (C10) holds for this element; straightforward ways to ensure this is using two identical detectors with different thresholds and exploiting the assumption that $V_{CC}$ changes at most at rate K, or to use a detector with (at least) three-valued output.

Moreover, the detector's output must indicate whether a voltage droop may be imminent. Accordingly, one requires for a correct DD module that if (I2) holds then (C10) (for any $i+1 \in N$ and $j-1=n$), (C11), and (C12) hold:

Guarantee of droop detection.

$$V_{CC}(t) < V_{low} + (1+n/Q)T_s K \Rightarrow \overline{E}_O^*(t) = 0 \text{ and} \quad \text{(C11)}$$

$$V_{CC}(t) \geq V_{high} \Rightarrow \overline{E}_O^*(t) = 1 \quad \text{(C12)}$$

The specifics of the implementation of the detector are of no concern to us. However, note that it is crucial that the detector's delay is small, as it adds to the response time of the circuit and thus affects the steepness K of droops that can be tolerated. This suggests to favor simple implementations.

The requirements (C11) and (C12) yield that the required gap between $V_{low}$ and $V_{high}$ is $$V_{high} - V_{low} > (1+n/Q)T_s K.$$

To show that the FAM-I is a correct implementation of the FAM, it may be proven that all input requirements of the FAM-I's submodules are fulfilled. More formally, for the FAM-I with correct implementations of its submodules and a chain of $n \geq 1$ delay elements, it may be proven that if (I1) and (I3) hold, the input requirements (I4), (I5), (I6), and (I7) hold for each delay element.

As a corollary, one obtains that for the FAM-I with correct implementations of its submodules, and a chain of $n \geq 1$ delay elements, it may be proven that if (I1) and (I3) hold, property (C1) holds and the output clock hightime is within $[T_s^-/2, T_s^+/2]$. The output clock period is at most $(1+n/Q)T_s^+$ and amortized $(1+1/Q)T_s^+ = T_I^+$.

It may now be shown that the FAM-I reacts to voltage droops as required by (C2). From the above, one already has that all delay elements' input and output requirements are fulfilled; specifically delay element n's output guarantees hold. It remains to be shown that the DD module correctly senses a droop and passes on this information to delay element n, which then reacts with an according phase shift.

More formally, for the FAM-I with correct implementations of its submodules, and a chain of $n \geq 1$ delay elements, it may be proven that if the delay constraints $t_{ofs} \geq t_{set}$ and $t_{ofs} + t_{hold} \leq T_s/2$, (I1), (I2), and (I3) are fulfilled, then property (C2) holds.

Overall correctness follows from the above together with (I3), i.e., the chain being long enough to ensure that metastability is always resolved before reaching (o.

More formally: if the delay constraints $t_{ofs} \geq t_{set}$ and $t_{ofs} + t_{hold} \leq T_s/2$, (I1), (I2), and (I3) hold, then the FAM-I with correct implementations of its submodules, and a chain of $n \geq 1$ delay elements, is correct.

Notably, the chain length n does not influence correctness assuming that no metastability occurs, but is of course relevant to ensure (I3) indeed holds. The delay chain achieves this by acting as a synchronizer chain of length n.

Circuits for the Phase Accumulator φ and the Delay Element that fulfill the modules' specifications will be presented next.

Circuit for Phase Accumulator. The phase accumulator behaves like a phase accumulator in a numerically controlled oscillator (NCO).

Figure 3:
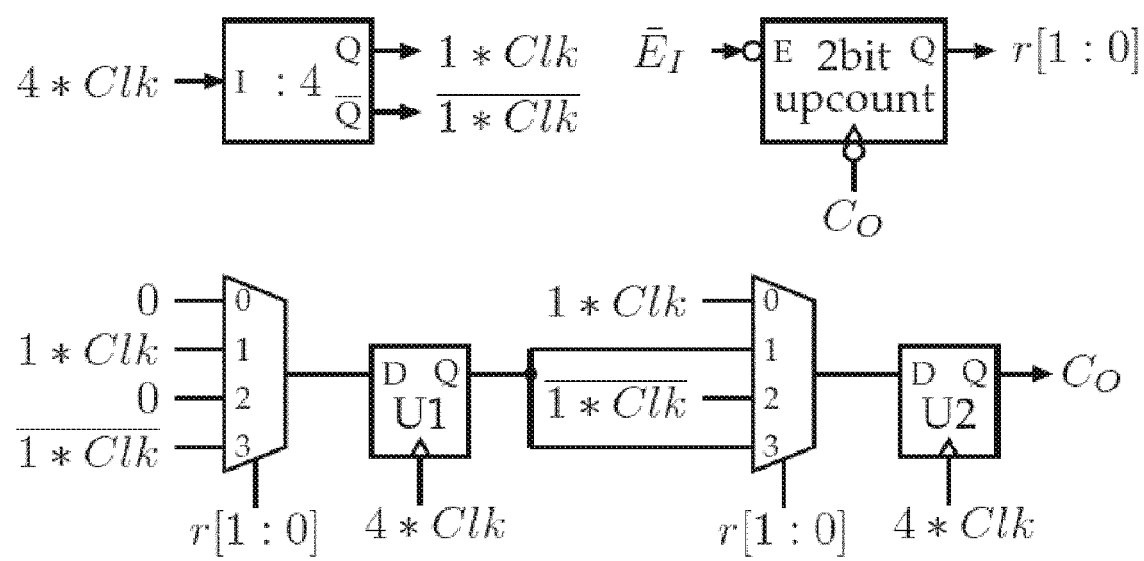
FIG. 3 shows a phase accumulator implementation φ-Div-I according to an embodiment of the invention, based on dividing the input clock (4*Clk) by four.

FIG. 3 shows phase accumulator implementation (φ-Div-I) based on dividing a the input clock (4*Clk)) by four [M. Függer, A. Kinali, C. Lenzen, and B. Wiederhake, "Fast all digital clock frequency adaptation circuit for voltage droop tolerance," in IEEE International Symposium on Asynchronous Circuits and Systems (ASYNC), 2018]. The division allows to generate the output phases without stringent requirements on delay matching. The binary 2-bit upcounter accumulates the phase shift, which is latched upon the falling edge of the clock output the phase accumulator produces, and selects the appropriates inputs to U1 and U2.

A natural implementation is to provide the phase accumulator with an input clock frequency of $Q/T_s$ and with each active input clock transition add a constant phase offset (plus an externally provided potential phase shift), thereby generating the output clock. Such a design, however, has the drawback that the phase accumulator with output frequency of, say, 2 GHz must internally run a counter at Q·2 GHz=8 GHz, thereby typically representing the frequency bottleneck of the overall FAM design. In addition, one might want to run the whole frequency adaption circuit at a higher frequency than the system, as this decreases the time required to respond to a droop; dividing the output clock yields a system clock that adapts even faster to droops, while only a very small part of the circuit runs at the higher frequency.

Figure 4:
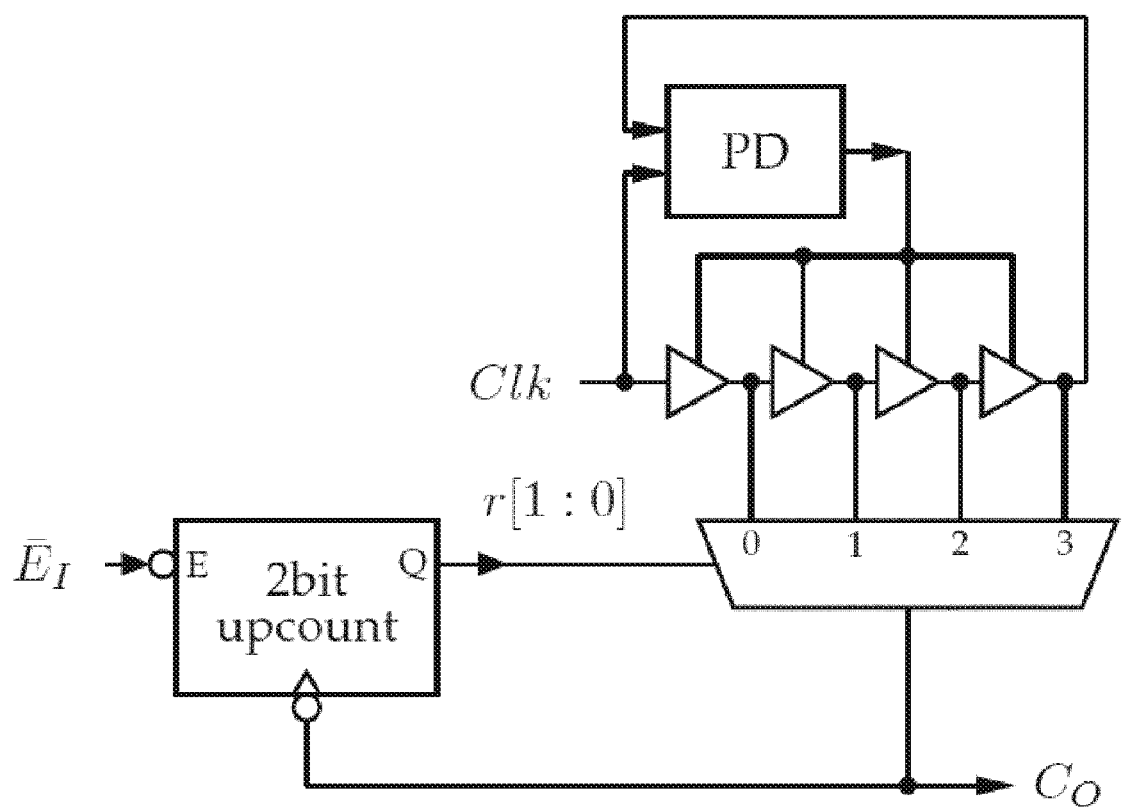
FIG. 4 shows an alternative phase accumulator implementation (φ-DLL-I) based on tapped DLL, formed by the phase detector PD controlling a starved inverter chain, a counter, and a MUX to select the phase.

FIG. 4 shows a phase accumulator implementation (φ-DLL-I) based on tapped DLL, formed by the phase detector PD controlling a starved inverter chain, a counter, and a MUX to select the phase as provided in [K. Wilcox et al., ibid]. Note the absence of a synchronizer for the counter enable in the present embodiment.

Their design is based on a tapped delay-locked loop (DLL) and a MUX that allows to select among the taps, thereby applying the required phase shift; see FIG. 4, in which the PLL is formed by a phase detector (PD) controlling starved inverters. Such a design has the advantage of no need for a faster internal clock and thus allows higher output clock frequencies: for example, [K. Wilcox et al., ibid] reports 3 to 4 GHz in 28 nm technology. As opposed to the original design in [Wilcox et al., ibid] the inventive phase accumulator implementation φ-DLL-I does not need to synchronize the delay enable signal to the input clock Clk of the DLL, saving two clock cycles in latency: Assumption (I3) guarantees a stable delay enable input at φ-DLL-I, which changes only with the falling clock edge of the first delay element. It will later be argued why (I3) holds with arbitrarily high probability. Formally, one obtains:

Lemma. The circuit φ-DLL-I in FIG. 4 correctly implements Module φ for Q=4.

Proof. The PLL, formed by the phase detector PD and the starved inverter chain, make sure that the tapped inverter outputs r∈{0,1,2,3} correspond to clock Clk phase shifted by 2πr/Q. The 2-bit counter increments modulo Q, triggered with the falling output clock edge $C_O$, given that the delay enable $\overline{E}_I$=0. From input constraint (I3) one has that $\overline{E}_I$ either is stable 0 or stable 1, but not in transition while being sampled. Each counter increment results in an additional phase shift of 2π/Q for the next rising clock edge, thereby ensuring (C3). Finally, (C4) is guaranteed by the fact that phase shifts are only applied after falling output clock edges and before the occurrence of the next rising output clock edge, together with input constraint (I1).

Figure 5:
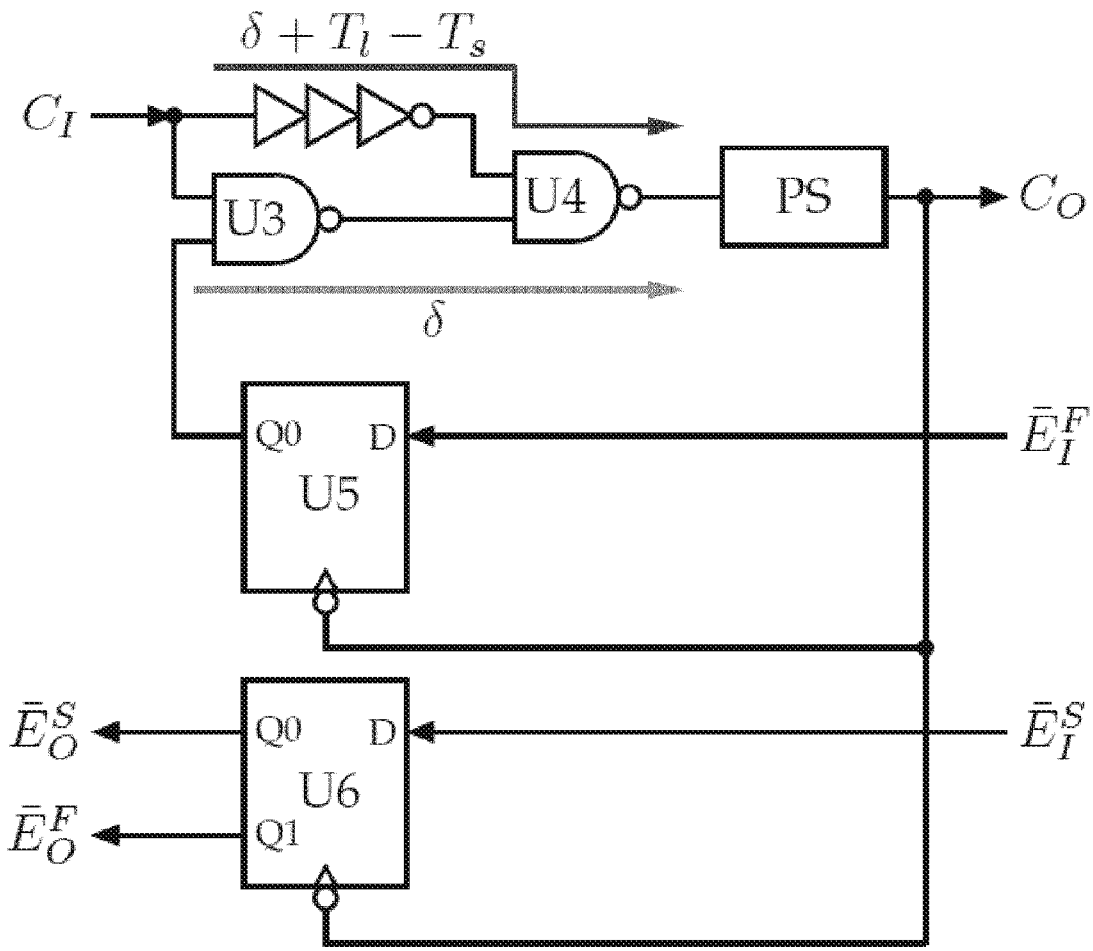
FIG. 5 shows a delay element implementation DE-I according to an embodiment of the invention.

FIG. 5 shows Delay Element Implementation (DE-I). U5 and U6 are falling edge triggered and have setup hold times of tset and thold. Outputs Q0 are slow-masking (i.e., 0-masking), and output Q1 is fast-masking (i.e., 1-masking). PS is a pulse shaping module.

Figure 6:
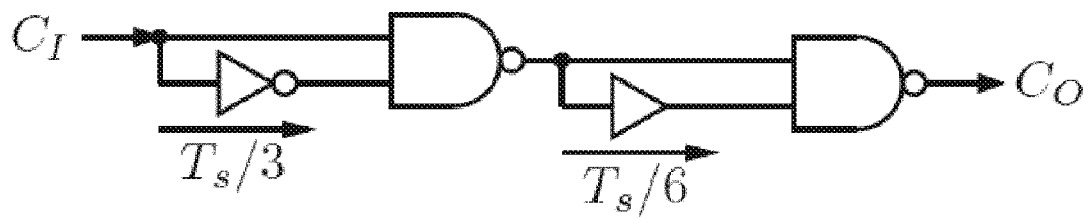
FIG. 6 shows pulse shaping module according to an embodiment of the invention.

FIG. 6 shows pulse shaping module. Requires a 010-input pulse of duration at least Ts/3 and guarantees an output pulse of duration Ts/3+Ts/6=Ts/2.

Figure 7:
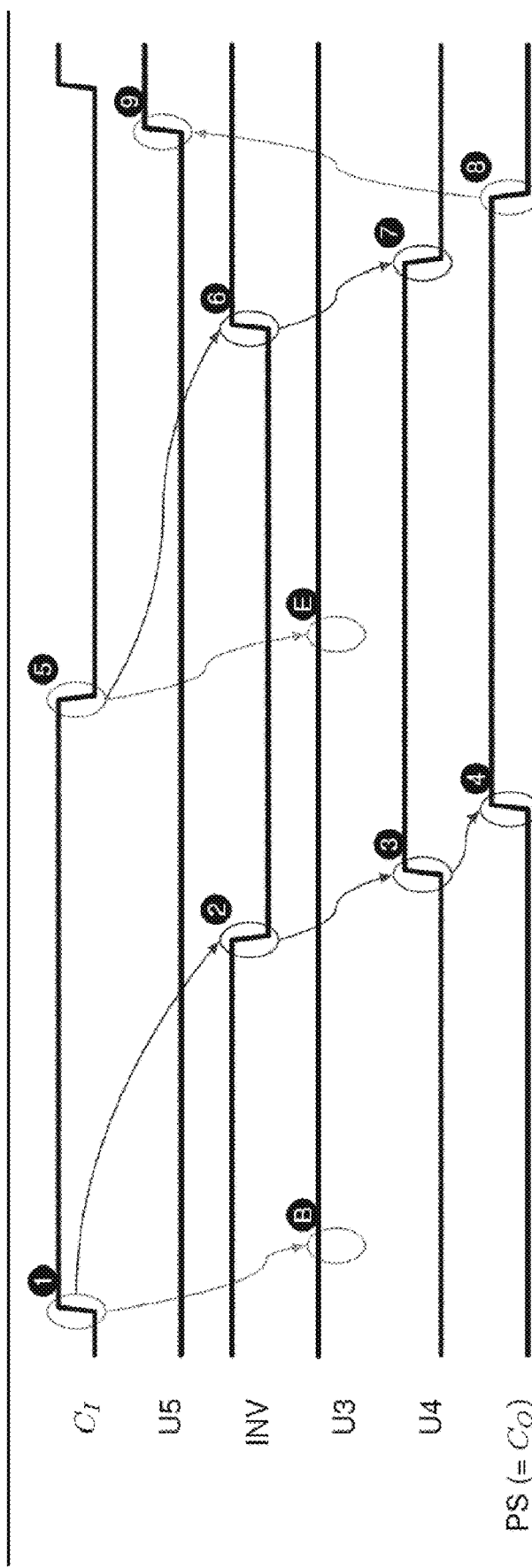
FIG. 7 shows a behavior of the DE-I for various behaviors of the U5 flipflop.
Figure 7:
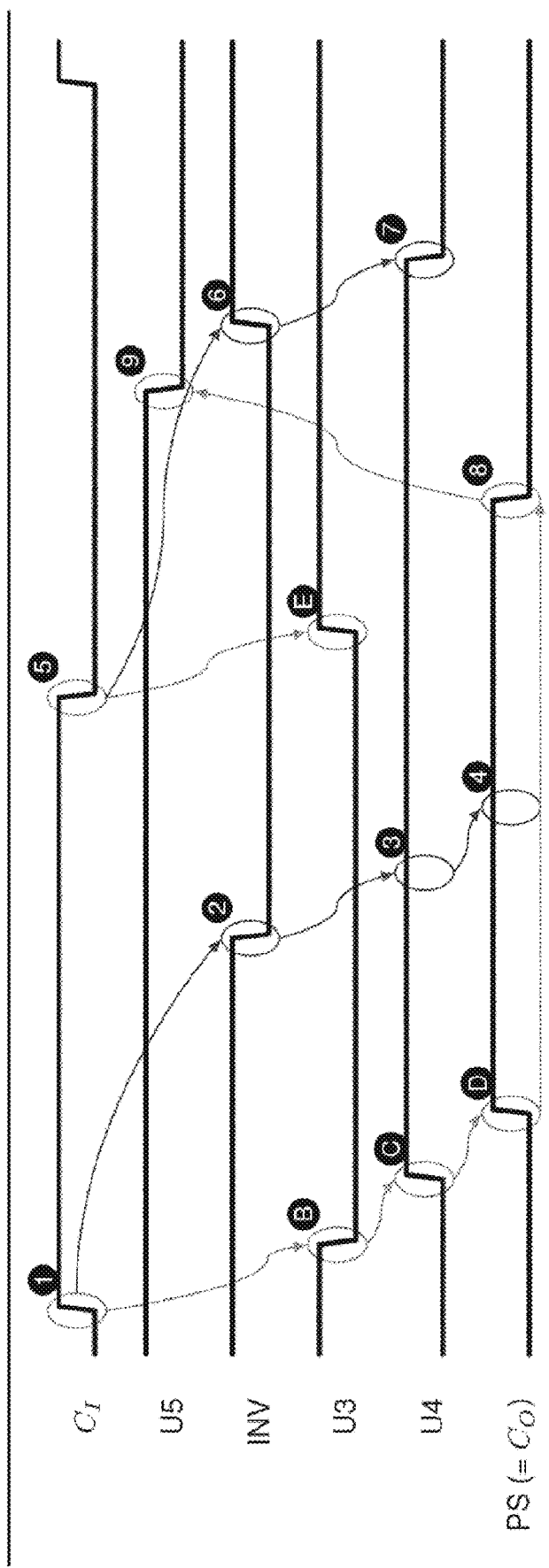
Figure 7:
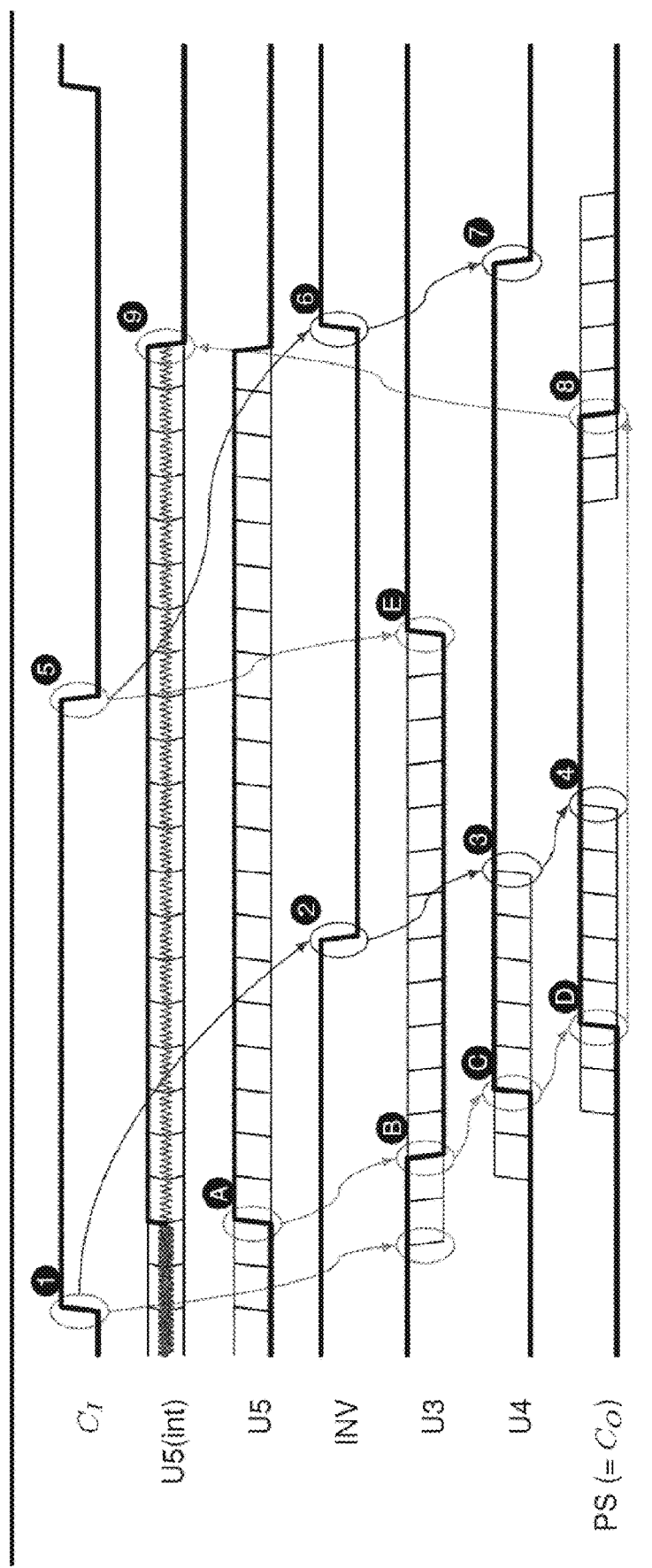

FIG. 7 shows a behavior of the DE-I for various behaviors of the U5 flip-flop. Signal U5(int) is the internal state of U5, INV the output of the odd inverter chain, and all other signals the output of the corresponding gate. Orange and blue lines show causal relations, brown represents the metastable internal state. One observes a total time of roughly Ts each.

Circuit for Delay Element. Consider the circuit DE-I in FIG. 5 with the pulse shaping circuit PS as depicted in FIG. 6. Concerning the flip-flops, output Q0 is required to be 0-masking (slow-masking), and output Q1 1-masking (fast-masking). One further requires that the flip-flop parameters fulfill $$t_{prop} < T_s/2 - \delta_{DE} - (T_f - T_s) - t_{ofs}, \quad (6)$$

$$t_{set} < T_s/2 - t_{ofs}, \text{ and } t_{hold} < \delta_{DE} + t_{prop}. \quad (7)$$

Figure 8:
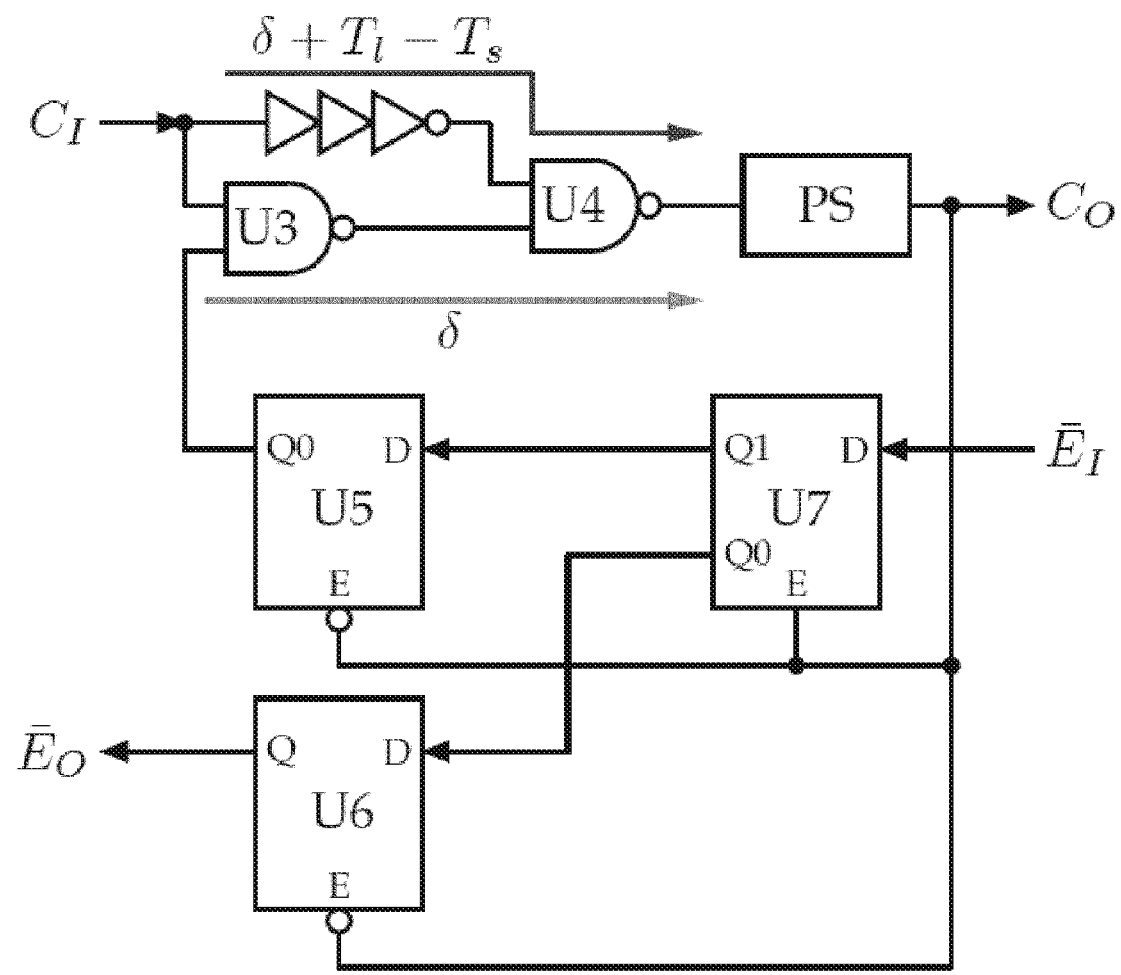
FIG. 8 shows a simplified delay element implementation sDE-I with single backward rail according to an embodiment of the invention.

FIG. 8 shows a simplified delay element implementation (sDE-I) with single backward rail. U5, U6, and U7 are latches. U7 provides a fast-masking (i.e., 1-masking) output to U5 and a slow-masking (i.e., 0-masking) output to U6. The output of U5 is slow-masking, while the output of U6 is not required to be masking.

FIG. 8a visualizes the behavior of the DE-I for the case of a clear $b_{i-1,j}^F$=0 stored in U5, caused by sampling $\overline{E}_I^F$=0 with the previous falling edge of PS(=$C_O$). As a result, the "slow" delay path of DE-I is enabled, propagating the $i^{th}$ rising clock edge of $C_I$ (❶ in FIG. 8c) via the inverter ❷, to U4 ❸, an finally to PS ❹. The pulse shaper then reshapes the pulse to $T_s/2$ width ❺, which triggers the flip-flop U5 to sample $\overline{E}_I^F$. In the example execution it is assumed $\overline{E}_I^F$=1 is sampled ❻, resulting in $b_{i,j}^F$=1.

Likewise, FIG. 8b visualizes the behavior of the DE-I for the case of a clear $b_{i-1,j}^F$=1 stored in U5. As a result, the "fast" delay path of DE-I is enabled, propagating the rising clock edge of $C_I$ ❶ via U3 ❺, to U4 ❻, and finally to PS ❼. Again, the pulse shaper reshapes the pulse to $T_s/2$ width ❽, triggering U5 to sample $\overline{E}_I^F$. In the present case $\overline{E}_I^F$=0 is sampled ❾, resulting in $b_{i,j}^F$=0.

FIG. 8c visualizes all potential signal traces of DE-I, including those where flipflop U5 is internally metastable $b_{i-j}^F$F=M. The thick, black signal trace shows an example where U5 is metastable: U5 resolves to 1 during execution causing U5 to make a clean 0 to 1 transition ❹. Observe that this triggers a delayed propagation along the short path ❹, ❺, ❻, and ❼. Also note that a metastable U5 cannot delay propagation beyond the slow path ❷, ❸, and ❹. The remainder of the execution is analogous to the cases before.

Lemma. The circuit DE-I in FIG. 5, with U5 and U6 initialized to 1, correctly implements a Delay Element for Q=4.

Proof. One proves the claim by induction over the pulse number i, where apart from the properties (C5)-(C10) it is claimed that U5 and U6 attain states $b_{i,j}^F$ and $b_{i,j}^S$ when being latched by the falling outgoing clock edge.

Combining the above, one obtains correctness of the FAM implementation. Note, however, that correctness relies on requirement (I3). Given the present circuit implementation, (I3) corresponds to the fact that the delay enable propagated through the n delay elements from the DD module to the φ module is not metastable when it arrives. From the fact that stable register values are propagated correctly, i.e., again result in stable register states of the element to the left, one deduces that metastability can only propagate through the chain when the register U6 of delay element j resolves exactly when register U6 of element j−1 latches its input; i.e., the chain acts as a synchronizer chain of length n. The overall probability of a failure can thus be bounded analogous to failure of an n-stage synchronizer. Specifically, as the chain of registers contains no logic gates, one can assume that $T_w=t_{set}+t_{hold}$ and the available metastability resolution time $T_{res}=nT_s-(n-1)T_w$.

For example, one may assume worst-case conditions for the droop detector ($f_d=f_c$). Using the values for common ASIC synchronizers (r=31.6 ps, $T_w$=8 ps) and a chain running at a high clock speed (n=5, $f_c$=4 GHz), this achieves a good MTBF:

$$T_{res} = 5 \cdot 0.25 \text{ns} - 4 \cdot 8 \text{ps} \geq 1.2 \text{ns}$$

$$MBTF \geq \frac{e^{T_{res}/r}}{f_d f_c T_w} = \frac{e^{1.2ns/31.6ps}}{4\text{GHz} \cdot 4\text{GHz} \cdot 8\text{ps}} \approx 7.6a$$

Apart from the delay constraints, this is the only technology-dependent aspect of the inventive approach. Hence, it is very easy to transfer the inventive design to different technologies. In particular, the length of the delay chain is simply the length of a synchronizer chain of sufficient MTBF for the respective technology and application.

The previous construction used two backward rails, which essentially propagate the same signal, but with different masking applied. It imposes the requirement that the droop detector provides two output signals, only one of which may induce metastability of the corresponding storage element when it is latched. While the constraint on the output of the detector may be straightforward to satisfy, it has negative impact on performance: To guarantee that not both capturing storage elements become metastable, the respective voltage thresholds for when the detector's outputs transition between 0 and 1 need to be sufficiently separated; however, via constraints (C11) and (C12), this entails that K (i.e., the maximum steepness of a droop) or the difference between $V_{high}$ and $V_{low}$ (and thus the minimum voltage under which a clock period of $T_s$ is sufficient) becomes smaller.

According to a further embodiment of the invention, one can simplify the interface to the droop detector and resolve this performance issue at the same time. The general idea is to separate the flip-flops U5 and U6 of the delay element into their constituent latches, "merge" the master latches into one, and ensure the separation by exploiting that, when intransparent, the (single) master latch can only stabilize either to 0 or to 1 (as opposed to the two master latches of the flip-flops U5 and U6 from FIG. 5); see FIG. 8 for the resulting modified implementation. More concretely, assume that the joint master latch U7 becomes metastable when it becomes intransparent, i.e., when the respective clock flank arrives at the delay element's output. This means that, after a short delay caused by the internal latency of the feedback-loop of the latch, its output voltage is (very) close to a fixed value corresponding to the unstable equilibrium state the latch is in. Any deviation from this equilibrium is amplified, resulting in stabilization to either high or low output voltage. Using standard masking techniques (e.g. high/lowthreshold inverters driven by the latch output), one can derive slow- and fast-masking outputs, taking the role of the two input signals provided to delay elements in the earlier solution. When the master latch stabilizes, only one of these outputs undergoes a transition, implying that only one of the slave latches can become metastable; more precisely, one ends up with the same set of possible states of the two slave latches as in the previous construction: 00, 0M, 01, M1, 11. Hence, this approach guarantees (C10) by construction, regardless of the (single) input signal provided to the modified module. Also here, it is critical to avoid latch implementations that can be driven into oscillatory metastability.

Figure 9:
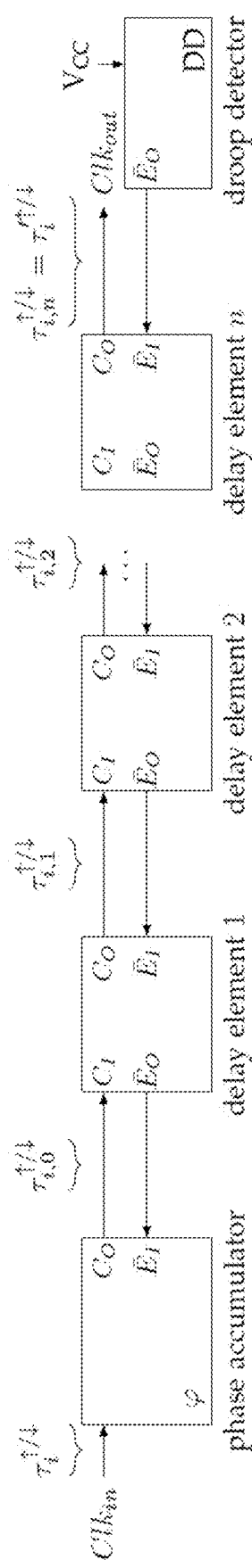
FIG. 9 shows a simplified FAM implementation sFAM-I with modified delay elements sDE and droop detector sDD according to a further embodiment of the invention.

FIG. 9 shows a simplified FAM implementation sFAM-I with modified delay elements sDE and droop detector sDD according to a further embodiment of the invention. The specification of the FAM remains identical. Correctness is shown analogously as well, where the property (C10) is not an output property of the droop detector and delay elements anymore, but rather an invariant, which delay elements ensure internally under the assumptions (I4), (I5), and (I7).

To formalize this, the specifications of the droop detector and delay element modules are adapted to match the system description given by FIG. 9.

In the following, all flip-flop parameters refer to the flipflops given by the master/slave pairs U7/U5 and U7/U6, respectively, which are assumed to be equal due to symmetry.

Module $\varphi$ (Phase Accumulator). The specification of the phase accumulator remains unchanged.

Simplified Delay Element (sDE). The delay element has clock input $C_I$ and clock output $C_O$. It receives a delay enable input $\overline{E}_I$ and provides a delay enable output $\overline{E}_O$.

In order to specify the delay element similarly to before, it is most convenient to specify $b_{i,j}*$ similarly as well. However, these values are now derived from the same input signal $\overline{E}_I$, with metastability masking taking place entirely within the element. Accordingly, with the same definitions of $r_{i,j}^{\uparrow}$ and $r_{i,j}^{\circ}$ as before, one integrates (C10) into the definition:

$$b_{i,j}^F b_{i,j}^S = \begin{cases} 00 & \forall t \in [-t_{set}, t_{hold}] : \overline{E}_1(r_{i,j}^{\downarrow} + t_{ofs} + t) = 0 \\ 11 & \forall t \in [-t_{set}, t_{hold}] : \overline{E}_1(r_{i,j}^{\downarrow} + t_{ofs} + t) = 1 \\ 00, 0M, 01, M1, \text{or } 11 & \text{(arbitrarily) otherwise.} \end{cases}$$

A correct (modified) delay element then guarantees (C5)-(C9), granted that (I4), (I5), and (I7) hold.

Simplified Droop Detector (sDD). The specification of the droop detector is changed so that there is only a single output $E_O$ that needs to satisfy (C11') and (C12'):

Guarantee of droop detection.

$$V_{cc}(t) < V_{low} + (1 + n/Q) T_s K \Rightarrow \overline{E}_O(t) = 0 \tag{C11'}$$

$$V_{cc}(t) \geq V_{high} \Rightarrow \overline{E}_O(t) = 1 \tag{C12'}$$

Correctness of the sFAM-I given in FIG. 9 follows analogously to the reasoning for the previous variant. As (C10) has been pushed into the modified definition of the $b_{i,j}*$, no modification to the proofs is necessary.

Corollary. If $t_{ofs} \geq t_{set}$, $t_{ofs} + t_{hold} \leq T_s/2$, (I1), (I2), and (I3) hold, then the sFAM-I in FIG. 9 with correct implementations of its submodules $\varphi$, sDE, and sDD (as specified in this section) and a chain of $n \geq 1$ delay elements is correct.

Concerning the implementation of the modified delay elements given in FIG. 8, one needs to argue that indeed the masking properties are satisfied. Again, it is required that the flip-flop parameters fulfill $$t_{prop} < T_s/2 - \delta_{DE} - (T_I - T_s) - t_{ofs},$$

$$t_{set} < T_s/2 - t_{ofs}, \text{ and } t_{hold} < \delta_{DE} + t_{prop}.$$

Corollary. The circuit sDE-I in FIG. 8, with U5 to U7 initialized to 1, correctly implements a Simplified Delay Element (sDE) for Q=4.

The circuit was implemented and simulated by the inventors, both in a highlevel logic simulator using VHDL as well as in Spice in three different variants, demonstrating that the required design constraints can be met for clock frequencies between 1 GHz and 3.3 GHz in 65 nm.

Based on the circuit specification and constraints above, the design entry in VHDL followed a standard approach. All sub-circuits used back-annotated gate delays, after synthesis in the UMC 65 nm process, and their constraints were met.

For synthesis, all flip-flops and gates were used from the UMC library. Delay elements were modeled using chains of minimal sized inverters with small RC elements in between (in the order of 100Ω and 10 fF, respectively).

The first variant is using the phase accumulator $\varphi$-Div-I as discussed in [Függer et al., 2018, ibid] with a 4 GHz input clock resulting in a 1 GHz output clock frequency.

As expected from the circuits presented in Section 3, the critical path is in the Module $\varphi$, the phase accumulator, as this part of the circuit runs at four times the clock frequency of the remaining parts. For maximum speed, the proper alignment of 4*Clk and 1*Clk is vital. The delay added on 1*Clk and 4*Clk by a naively implemented divide-by-4 circuit would easily consume the slack at the inputs of U1 and U2. In case this is handled properly, the critical path in the circuit is the loop from U2, $C_O$, via the up-counter and its output r[1:0] back to the multiplexer and the inputs of U1 and U2. The simulations showed that the circuit could be clocked well in excess of 4.5 GHz resulting in an output clock frequency of over 1.1 GHz. Adding some margins, it was decided to use a clock of 1 GHz for the simulations.

The complete circuit consists of the phase accumulator φ-Div-I as shown in FIG. 3 and seven delay elements as shown in FIG. 5. The input clock ran at 4 GHz, leading to a nominal clock frequency of 1 GHz. A sharp and steep voltage droop from nominal 1.1 V down to 0.95 V was used, lasting slightly over 10 ns in duration, with a fall and rise time of 10 ps in order to capture a worst-case scenario of a sharp high-frequency droop with a duration of only a few clock cycles. The Spice simulation results can be seen in FIG. 10 and a zoomed version around the first droop in FIG. 11.

Figure 10:
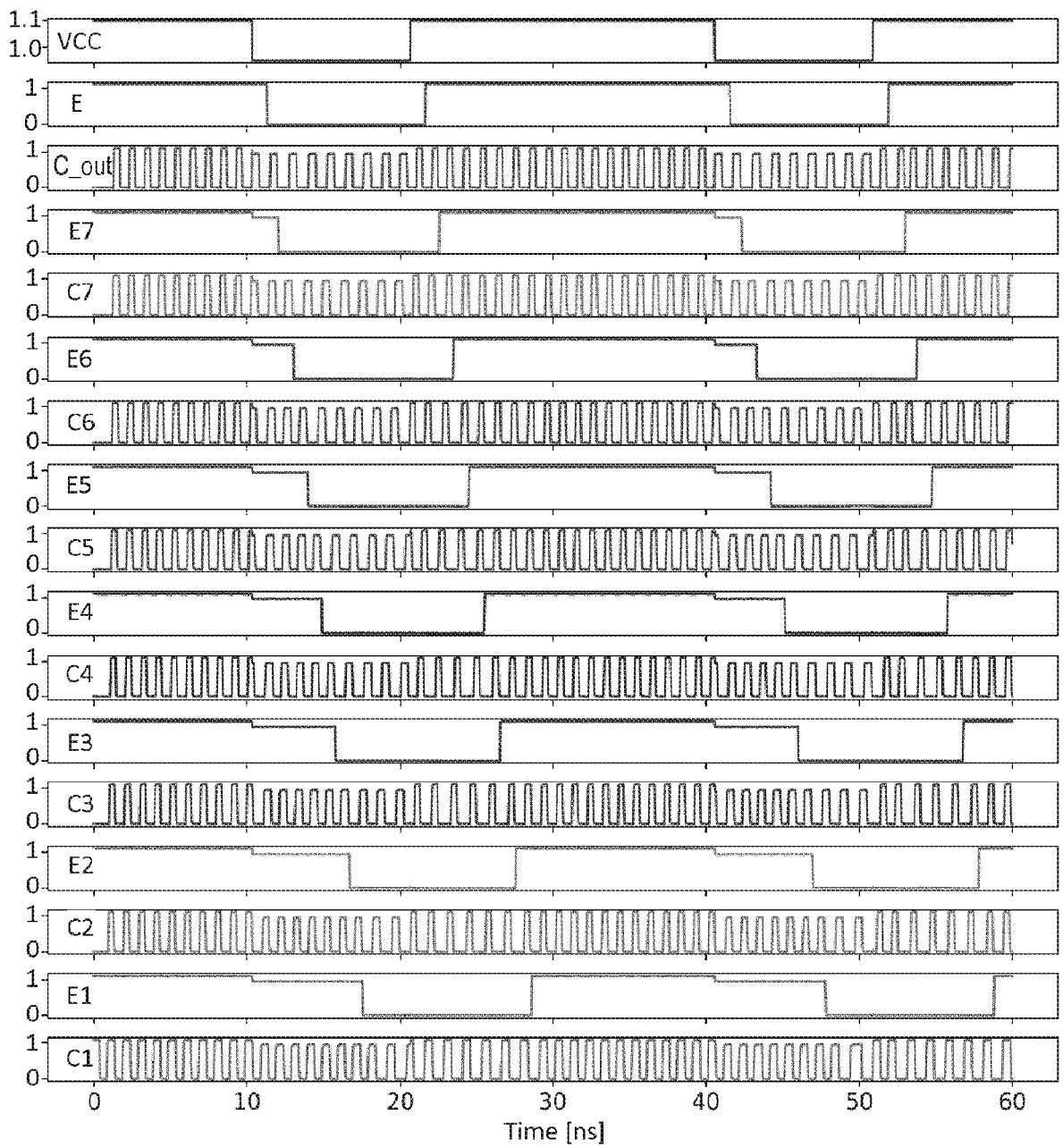
FIG. 10 shows results of a Spice simulation of the complete circuit running at 1 GHz clock frequency.

FIG. 10 shows results of the Spice simulation of the complete circuit using the phase accumulator of [Függer et al., 2018, ibid] and running at 1 GHz clock frequency. The graphs show the supply voltage "VCC", the droop detector output "E" and pairs of delay enable and clock signals at the boundary between two delay elements. "C1" and "E1" are the clock and the delay enable signals, respectively, between the phase accumulator and the first delay element, "C2" and "E2" between the first delay element and the second, and so forth until "E7" and "C7" being between the second last and the last delay element. "C_out" and "E" are the output and input, respectively, of the last delay element. The graphs show the quick reaction time of the system to droops, well within a single clock cycle from the assertion of the delay enable, both at the start of the droop and its end. The delay enable and a "zone" of slow clock cycles trickle backward in the chain until they get absorbed by the phase accumulator. Even though the droop visibly affects the circuit elements' operation and output voltage, their timing behavior is still as desired.

Figure 11:
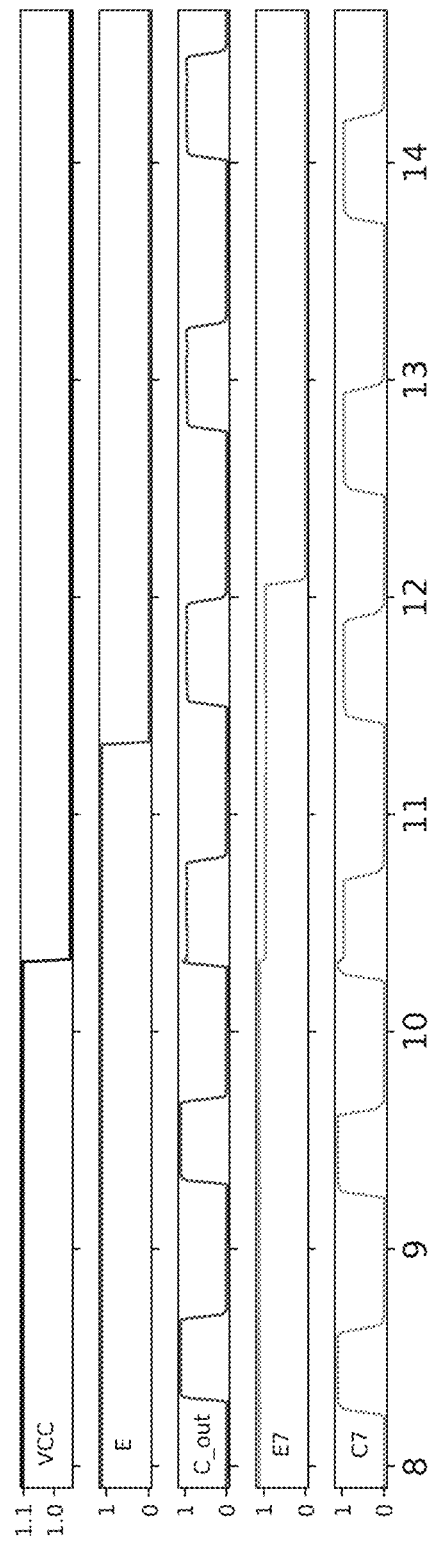
FIG. 11 shows zoom in around the first droop.

FIG. 11 shows zoom in around the first droop. Observe the immediate stretching of "C_out" due to the voltage droop. The last delay element samples "E=o" and thus (i) applies the phase shift to "C_out" and (ii) sets "E7=0" with the falling transition of "C_out" at 12 ns. Delay element 7 then samples "E7=0" and thus applies the phase shift to "C7" with the falling transition of "C7" at 13 ns.

The top-most graph shows the supply voltage and its drop to 0.95 V. The second graph "E" shows the simulated output of the droop detector. A delay of 1 ns was assumed for the droop detector. The third graph "C_out" denotes the clock output of the inventive circuit. The remaining graphs are pairs of the delay enable and clock signals passed between the delay elements, with corresponding signals shown in the same color, backwards from the clock output to the phase accumulator: "E7" and "C7" are the enable and clock signal between the last and second last delay element, "E6" and "C6" the signals between the second and third last, etc. The signals "E1" and "C1" are between the phase accumulator and the first delay element.

As can be seen, the output clock frequency adapts to the droop detect signal within a single clock cycle, both at the start and the end of the droop. The delay enable trickles backward in the chain and finally gets absorbed in the phase accumulator. As the droop lasts for approximately 9 clock cycles, this results in two clock cycles being dropped. Note that, because there are seven delay elements in the chain, the phase accumulator has just seen the delay enable signal by the time the droop is over. Yet the output clock immediately resumes its high-frequency operation, thus minimizing the performance impact of the droop.

In the simulation, output requirement (C2) is violated. This is a consequence of the almost instantaneous voltage droop, violating constraint (I2); there is no time for the circuit to react before the voltage is too low. If the droop would be less steep, the voltage would still be sufficiently high until the clock speed is adapted. However, the input given here was deliberately chosen to clearly visualize the response time between the detection threshold $V_{low}+(1+n/Q)T_sK$ (cf. (C11)) being reached and sFAM-I adapting the clock period, which is independent of the steepness of the droop.

Replacing the phase accumulator by the implementation based on a tapped DLL, φ-DLL-I from [K. Wilcox et al., ibid], the clock speed can be increased significantly, as the phase accumulator does not need to run at four time the clock frequency of the remaining circuit.

Using this approach, the phase accumulator can operate at frequencies well above 4 GHz. The element that limits the clock frequency thus shifts from the phase accumulator to the delay elements DE-I or sDE-I, respectively, and the pulse shaping module.

The delay selection within the delay element needs to ensure that the delay difference between the two paths, $T_l-T_s$ matches the delay steps within the phase accumulator φ-DLL-I, i.e. that prolonging the current clock cycle does not cut into the next clock cycle and violates (I4). A major problem here is the slight asymmetry in rise and fall times of the gates and their slew rate dependent delay. Both lead to a change of high and low times of the clock pulses, which has to be compensated by the pulse shaping module, thus reducing its slack. The slew rate dependence also induces different delays during droops, which in turn requires additional slack in order to satisfy (I4) and (I5).

Similar problems arise from the delay paths in the pulse shaping module, although in this case the issue is to match the delays of the first and second half of the pulse shaper. In order to get a well-defined output pulse, the pulse shaping module is required to generate a pulse with high-time of $T_s/2$. Additionally the second half needs to have a delay strictly lower than the first half. Matching the delay elements such that, including the delays through the NANDgates, these conditions are met for both the rising and falling edge, even during a droop and with changing slew rates, ultimately limits the clock frequency in the present implementation.

Pushing the circuit close to its limit (or rather beyond its limit, see below), a maximum clock frequency of 3.3 GHz was achieved, limited by the stability of the pulse shaping module.

Figure 12:
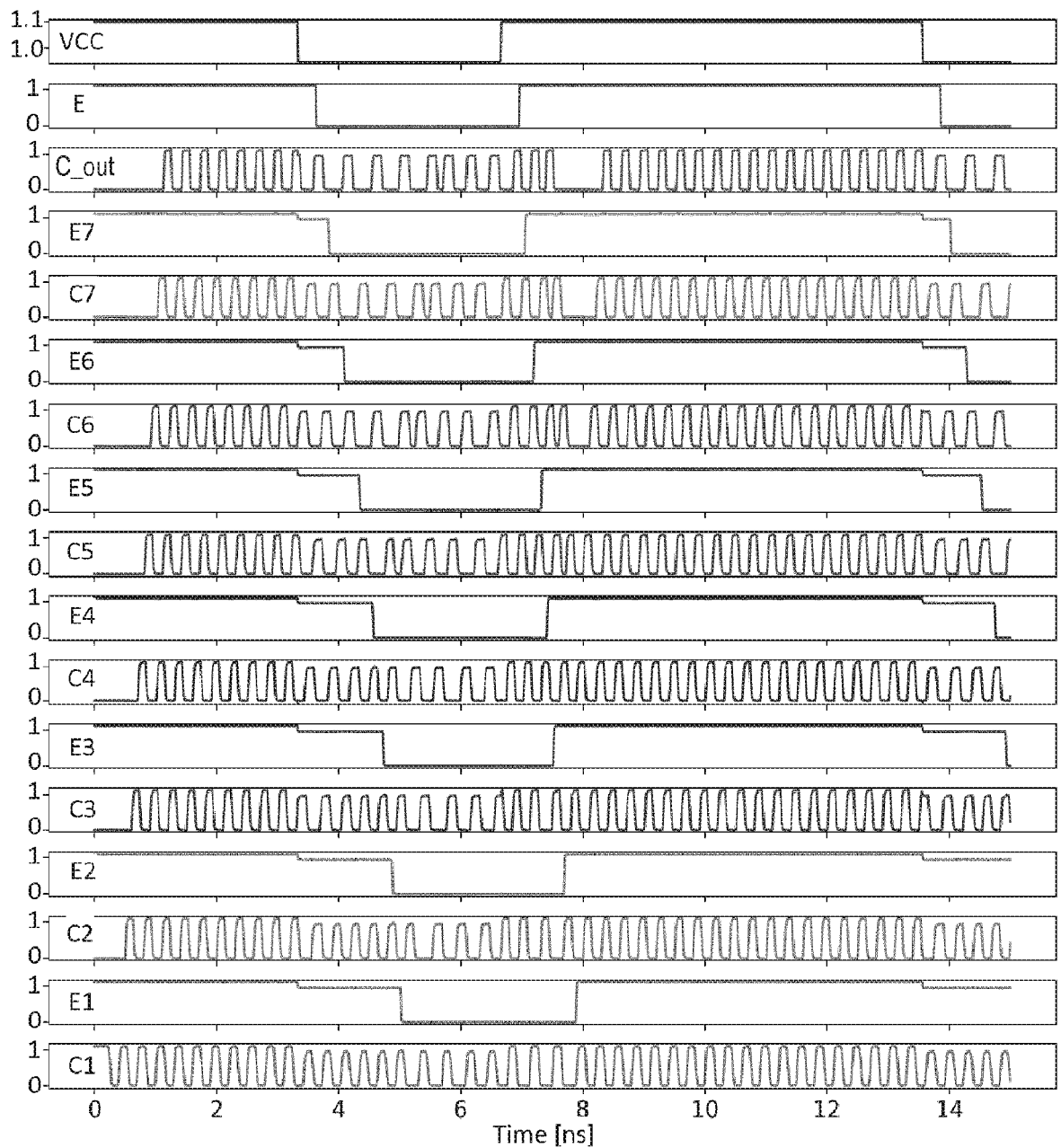
FIG. 12 shows results of a Spice simulation of the circuit using φ-DLL-I.

FIG. 12 shows results of the Spice simulation of the circuit using φ-DLL-I. The too short clock pulse around 5.8 ns and the missing clock pulses around 8 ns illustrate the importance of a supply voltage independent delay design for the clock adaption circuit.

To ensure a more realistic setting, a faster droop detection circuit with a reaction time of 300 ps was also assumed. The graph shows nicely that the circuit quickly responds to the droop, just like variant 1.

However, there are two issues with the circuit's behavior: Clearly visible, there is a gap, with lost clock pulses, in the output clock, forming around 8 ns. The source of this issue is the restoration of the proper supply voltage, which speeds up the buffers in the delay line of the φ-DLL-I. Thus there is one shortened clock cycle. The rise/fall time dependence in the delay elements and pulse shapers leads to a contraction of the low part of the clock pulse. The contraction continues until one pulse shaper rejects the pulse, which then leads to the gap. One may expect this to be another consequence of violating (C2), as the power supply rising from 0.95V to its nominal 1.1V within 10 ps results in a too rapid change in switching times. However, the effect is too pronounced even when assuming a smaller slope of the droop.

Secondly, there is a too short pulse, barely visible, in $C_{out}$ around 5.8 ns. Its source is a slightly too long high time at the output of C2 at about 3.8 ns. This is due to slight mismatch in the delays of rise and fall times within the delay element, which becomes exaggerated by the voltage droop.

Both issues show that the circuit, although the initial design suggested that the circuit should work correctly, violates the constraints of the inventive design. This is a consequence of the standard design approach not taking into account the dynamic voltage conditions during a droop. In principle, one could use conservative bounds on the timing behavior of circuit elements within a voltage range of $[V_{min}; V_{max}]$ and a (maximum) rate of change of input voltage of K is a feasible approach to ensure correct operation of the circuit. Unfortunately, such conservative bounds would result in substantially smaller bounds on the frequency at which the inventive FAM implementation can run. Thus, special care has to be taken in order to ensure correct and fast operation of the circuit under dynamic conditions.

According to the invention, there are two ways to handle the supply voltage induced problems. One is to use circuits that have a lower speed dependence on power supply voltage variations, like, e.g. current mode logic (CML). On one hand, the increased static power consumption of CML is of less concern here than in more general circuits, as this circuit is constantly switching. On the other hand, the potentially higher supply voltage requirements might be an issue. Regardless of the solution employed, such an approach is likely to be more technology-dependent and beyond the scope of this article.

In contrast, the second approach is very straightforward. One may use a separate, stabilized power supply for the clock circuit to avoid the performance impact of varying supply voltage. This is common practice for clocking circuits and, due to the relatively small size of the present FAM implementations, much easier to achieve than a stable power supply for the entire chip.

Figure 13:
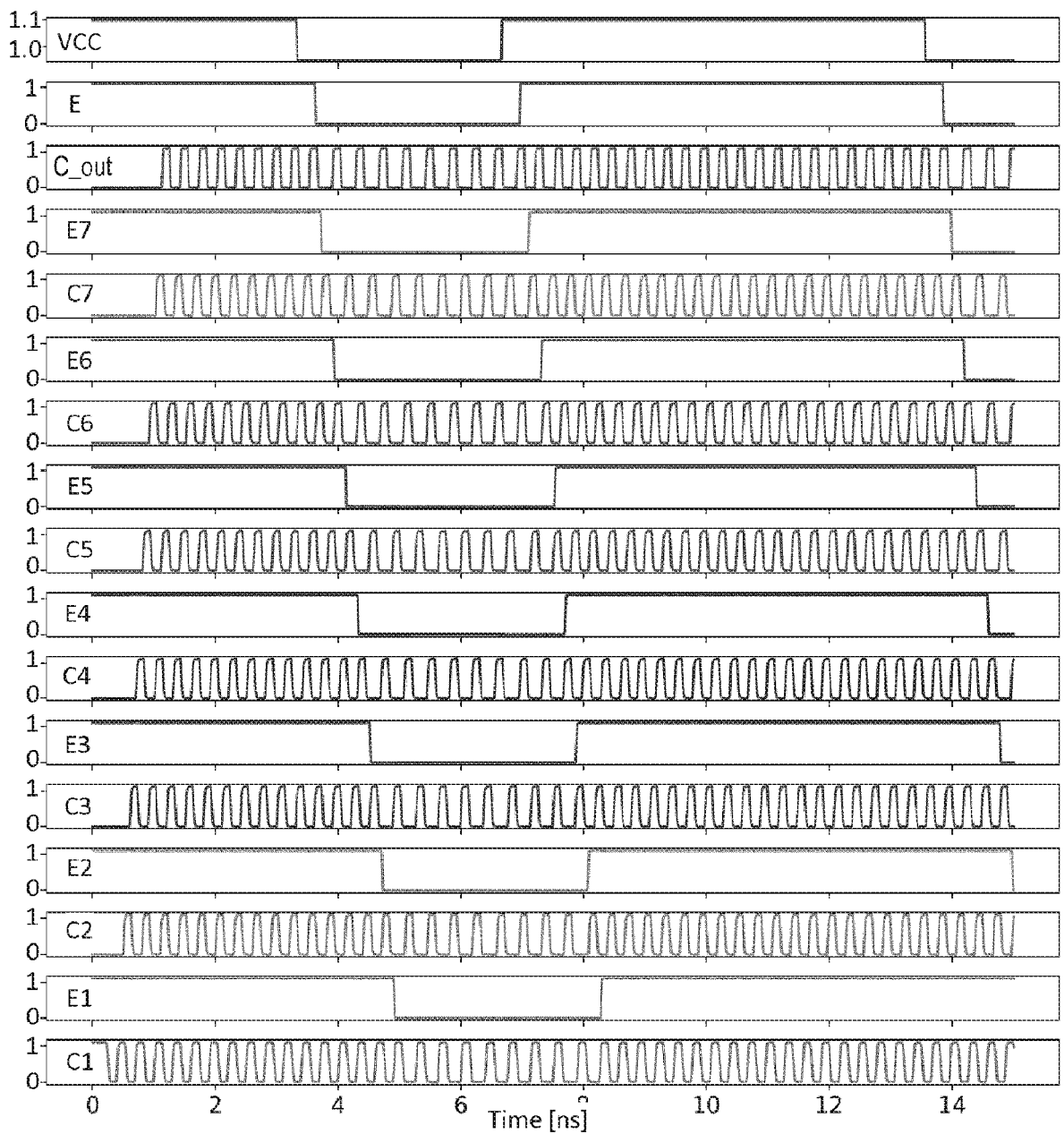
FIG. 13 shows results of a Spice simulation of the circuit using φ-DLL-I with separate, stable supply voltage for the clock generation circuit.

FIG. 13 shows results of the Spice simulation of the circuit using -DLL-I with separate, stable supply voltage for the clock generation circuit. Without the voltage change induced timing constraint violations the circuit reacts quickly and reliably to the signal provided by the droop detector. FIG. 13 shows nicely that, under stable supply voltage, the same circuit that failed to produce the desired output behavior in FIG. 12 works correctly with an independent, stable power supply. Observe the expected extremely fast reaction time, both slowing the system clock down when a droop occurs and speeding it up to nominal speed when the droop is over.

CONCLUSION

High-frequency voltage droops consume a significant fraction of the clock guardband. A circuit was proposed that allows to react to steep and high-amplitude droops, without the need to halt the clock. The circuit is based on detecting droops and propagating this information along a delay line, back to a DCO that accounts for the respective phase offset. The clock signal travels in the opposite direction through the delay line. Care had to be taken in handling metastability: embodiments of the invention make use of masking flip-flops, ensuring that no glitches are introduced in the clock signal.

The inventive design may be verified by correctness proofs and synthesized it in UMC 65 nm, running VHDL and Spice simulations with a 1 GHz and 3.3 GHz input clock respectively, which are in accordance with theoretical predictions. Going to high speeds the second order effects of the circuit become an issue and an appropriate design methodology has to be chosen to counteract those effects.

The invention claimed is:

1. A frequency adaptation circuit comprising:
   one or more circuits for delaying an electric signal; and
   a voltage droop detector,
   wherein each circuit for delaying an electric signal comprises:
   an input for the electric signal;
   an input for a control signal;
   a first storage element for storing the control signal;
   a second storage element for the storing the control signal;
   an output for outputting the control signal stored in the second storage element;
   a delay element for delaying the electric signal; and
   an output for the delayed electric signal, wherein the electric signal is delayed, based on the stored control signal,
   characterized in that
   the first storage element is a metastability-masking flip-flop, and
   wherein a digital phase accumulation module accumulates the control signal value output by a delay circuit into its phase offset.

2. The frequency adaptation circuit according to claim 1, wherein the phase accumulation module skips a clock cycle whenever its accumulated phase reaches a full period.

3. The frequency adaptation circuit according to claim 1, wherein the input clock of the phase accumulation module is four times the system clock.

4. The frequency adaptation circuit according to claim 1, wherein the electric signal is a clock signal.

5. The frequency adaptation circuit according to claim 1, wherein the first storage element is clocked by a delayed clock signal.

6. The frequency adaptation circuit according to claim 1, wherein the delay element is an inverter.

7. The frequency adaptation circuit according to claim 1, further comprising a pulse shaping module for shaping the electric signal.

8. The frequency adaptation circuit according to claim 1, wherein the control signal is a digital control signal.

9. The frequency adaptation circuit according to claim 1, wherein the second storage element is clocked by the delayed electric signal.

10. The frequency adaptation circuit according to claim 1, wherein the frequency of the generated clock output is decreased by a configurable factor.

* * * * *